United States Patent [19]

Kishi

[11] Patent Number: 4,994,769
[45] Date of Patent: Feb. 19, 1991

[54] SSB MODULATION AND DEMODULATION APPARATUS

[75] Inventor: Takahiko Kishi, Tokyo, Japan

[73] Assignee: Kabuskiki Kaisha Kenwood, Tokyo, Japan

[21] Appl. No.: 533,858

[22] Filed: Jun. 6, 1990

[30] Foreign Application Priority Data

Jun. 5, 1989 [JP] Japan .................... 1-146481

[51] Int. Cl.$^5$ .............................. H03C 1/52
[52] U.S. Cl. ..................... 332/170; 375/61
[58] Field of Search ........... 332/170, 171; 375/39, 375/43, 50, 61

[56] References Cited

U.S. PATENT DOCUMENTS

4,510,467 4/1985 Chang et al. .......... 332/170 X
4,835,791 5/1989 Daoud ................... 332/170 X Primary Examiner—Robert J. Pascal
Attorney, Agent, or Firm—Sixbey, Friedman, Leedom & Ferguson

[57] ABSTRACT

In an SSB modulation/demodulation apparatus having a band-pass filter having a plurality of switchable bandwidths for restricting a signal transmission bandwidth, and a Hilbert converter constructed of a network having a pass band over all frequency ranges, the Hilbert converter is a digital Hilbert converter arranged to be set with switchable Hilbert conversion coefficients. The apparatus includes a Hilbert conversion characteristics changeover information memory for storing a plurality of Hilbert conversion coefficients corresponding to a plurality of Hilbert conversion coefficients for different bandwidths and different sideband suppressions; and a Hilbert conversion characteristics changeover unit responsive to a change in the bandwidth of the band-pass filter for reading corresponding ones of the Hilbert conversion coefficients from the Hilbert conversion characteristics changeover information memory, and supplying the read-out Hilbert conversion coefficients to the digital Hilbert converter means to change the Hilbert conversion coefficients previously set.

6 Claims, 6 Drawing Sheets

CENTER OF LOWER SIDEBAND    CENTER OF UPPER SIDEBAND

FIG. 9

CENTER OF LOWER SIDEBAND    CENTER OF UPPER SIDEBAND

SSB MODULATION AND DEMODULATION APPARATUS

BACKGROUND OF THE INVENTION

1. Field of the Invention

The present invention relates to an SSB modulation and apparatus, and more particularly to an SSB modulation and demodulation apparatus having a variable communication bandwidth.

2. Related Background Art

An SSB modulation/demodulation apparatus modulates an audio signal into an SSB modulated wave having a single side band component, and demodulates an SSB modulated wave into an original audio signal. Such an SSB modulation/demodulation apparatus is used in an SSB transmitter/receiver capable of performing communication with a low power and narrow communication bandwidth.

Figure 6:
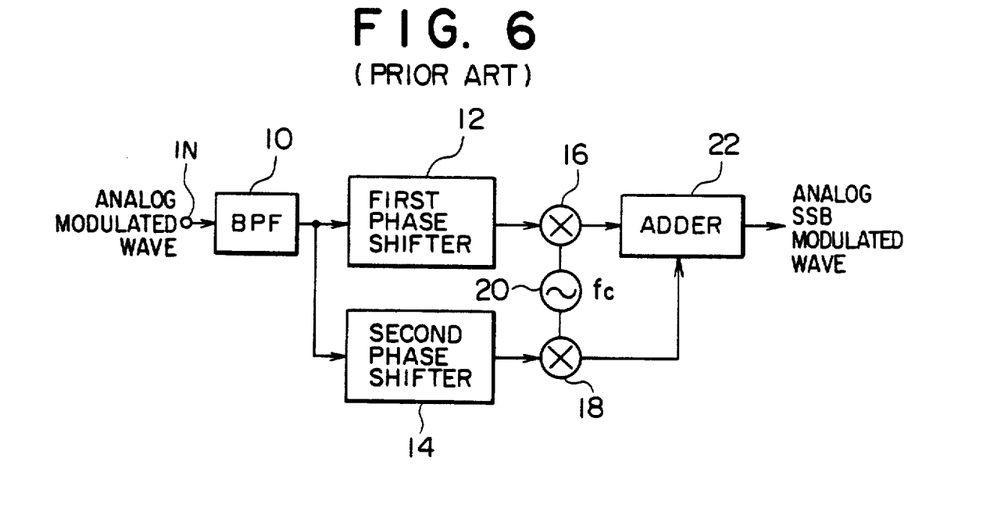
FIG. 6 is a block diagram showing a conventional analog SSB modulation apparatus.

FIG. 6 is a block diagram showing a conventional analog SSB modulation apparatus.

An analog modulating wave $D_A$ of audio signal is inputted to a band-pass filter (BPF) 10 to restrict the bandwidth of the analog modulating wave. The analog modulating wave from BPF 10 is inputted to first and second phase shifters 12 and 14 to Hilbert-convert it into first and second modulating waves each having a phase difference of 90 degrees, which are then supplied to first and second multipliers 16 and 18, respectively.

The first and second phase shifters 12 and 14 constitute a Hilbert converter.

The first and second multipliers 16 and 18 are inputted with first and second carriers, respectively. The first and second carriers are generated by a carrier generator 20, and each has a carrier frequency fc and a phase difference of 90 degrees. The first and second modulating waves are respectively multiplied by the first and second carriers to obtain first and second multiplication signals.

The first and second multiplication signals are added together by an adder 22 to generate an analog SSB (LSB) modulated wave. If a subtracter is used in place of the adder 22, an analog SSB (USB) modulated wave is generated.

Figure 7:
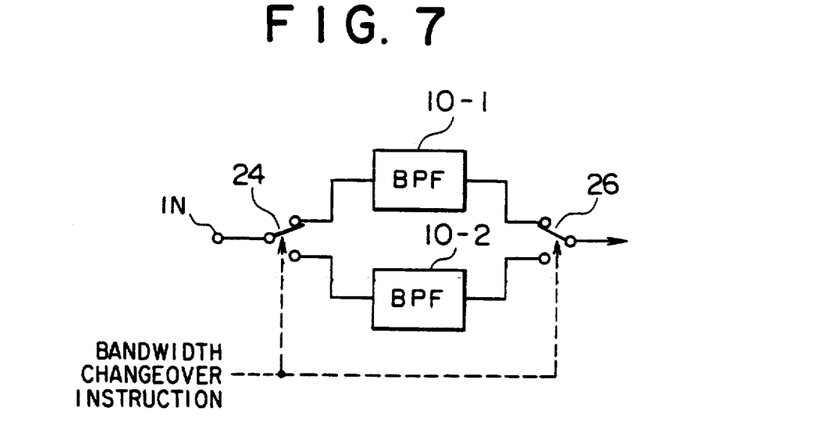
FIG. 7 is a block diagram showing an example of BPF shown in FIG. 6 wherein the bandwidth is made variable.

For example, if an audio signal is intended to be transmitted while retaining a good quality of sounds, the bandwidth of BPF 10 is made broad, whereas if a number of stations are intended to be communicable at the same time, the bandwidth is made narrow. In such a case, two BPFs 10-1 and 10-2 one with a broad bandwidth and the other with a narrow bandwidth are used as shown in FIG. 7 wherein upon a user designation of a desired bandwidth, a bandwidth changeover instruction is generated to activate switches 24 and 26.

The first and second phase shifters 12 and 14 used in analog Hilbert conversion are constructed of a pair of networks having a pass band over all frequency ranges. With a fixed order of each phase shifter, if the bandwidth for ensuring the 90 degree phase difference between the first and second phase shifters 12 and 14 is narrow, the precision of Hilbert conversion characteristics may be made high so that the sideband suppression is made high (refer to a solid line curve A shown in FIG. 2). On the other hand, if the bandwidth for ensuring the 90 degree phase difference is broad, it is necessary to lower the precision of Hilbert conversion characteristics, so the sideband suppression is degraded (refer to a broken line curve B shown in FIG. 2).

For this reason, the Hilbert conversion characteristics of the first and second phase shifters 12 and 14 are arranged to be changed upon changeover of the bandwidth of BPF. If a broad bandwidth of BPF is selected, the bandwidths of the first and second phase shifters 12 and 14 are also made broad, while being contended with a low sideband suppression. On the contrary if a narrow bandwidth of BPF is selected, it is desirable that the bandwidths of the first and second phase shifters 12 and 14 are also made narrow to obtain a high sideband suppression.

However, the Hilbert converter of the first and second digital phase shifters 12 and 14 constructed of analog circuits has essentially unstable Hilbert conversion characteristics, and moreover the Hilbert conversion characteristics have a critical change during its adjustment and are difficult to be adjusted From this reason, the bandwidth of a conventional Hilbert converter has been remained unchanged even if the bandwidth of BPF is changed.

Figure 8:
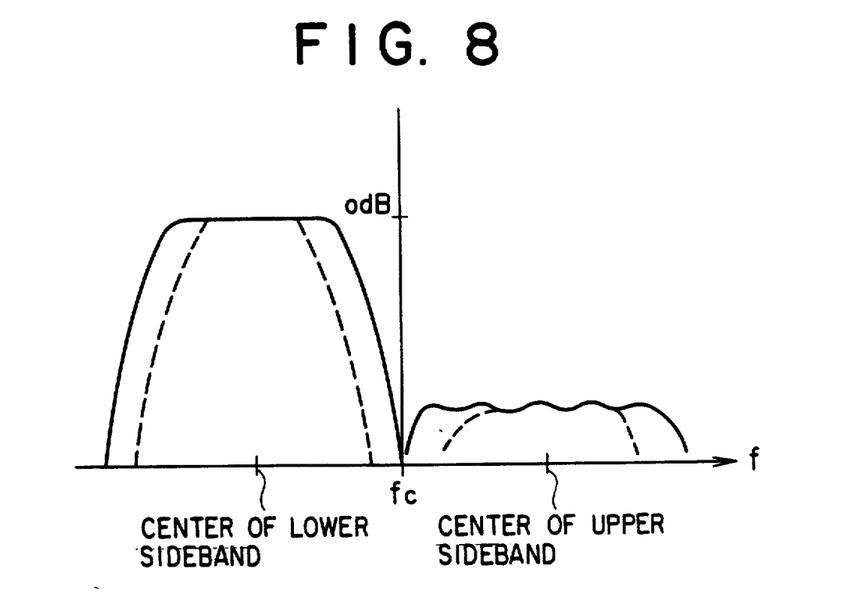
FIG. 8 shows the frequency-gain characteristics of an analog SSB modulation apparatus with respect to the pass band and stop band wherein the characteristics of BPF are made variable and the Hilbert conversion characteristics are remained fixed.

The frequency versus gain characteristics of a conventional SSB modulation apparatus are shown in FIG. 8, with respect to the pass band (for lower sideband) and stop band (for upper sideband).

The solid line curve A shown in FIG. 8 stands for a broad bandwidth of BPF, and the broken line curve B for narrow bandwidth. For both the narrow and broad bandwidths, the sideband suppression is low and spurious signals of certain level are generated.

Figure 9:
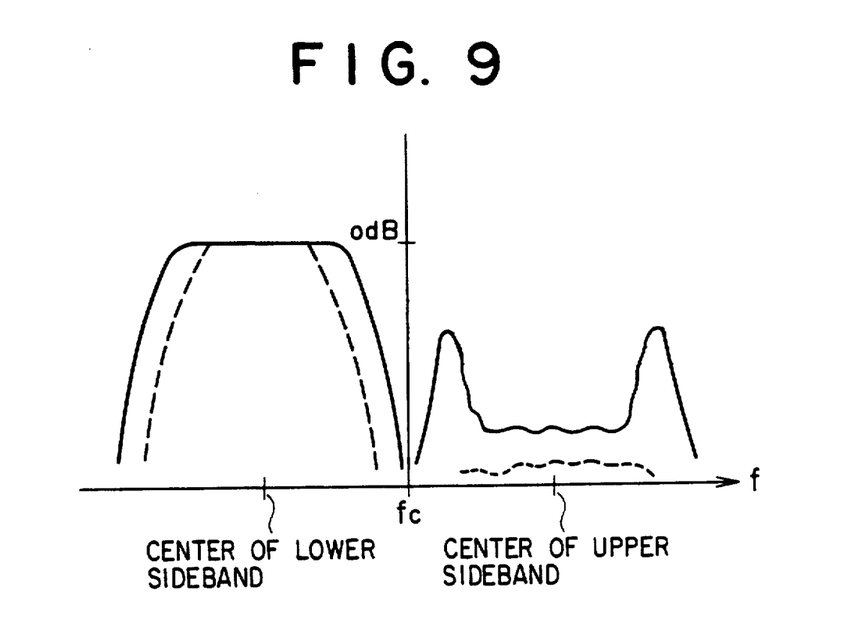
FIG. 9 shows the frequency-gain characteristics of an analog SSB modulation apparatus with respect to the pass band and stop band wherein the Hilbert conversion characteristics are made variable in correspondence with a change in the characteristics of BPF.

If the bandwidth of a Hilbert converter were changed in correspondence with a change in the bandwidth of BPF, the frequency versus gain characteristics will become, for example, as shown in FIG. 9.

As shown by the solid line curve A in FIG. 9, spurious signals of high level may be generated because of variation in the Hilbert conversion characteristics relative to a given bandwidth of BPF.

Similar problems of sideband suppression is also associated with an SSB demodulation apparatus which uses a Hilbert converter constructed of analog circuits Namely, the Hilbert conversion characteristics are remained broad, so that the sideband suppression is poor even if the narrow bandwidth of BPF is selected, and interference of certain level is inevitable.

Further, if the bandwidth of a Hilbert converter is arranged to be changed, there is a possibility of high level interference because of variation in the Hilbert conversion characteristics.

SUMMARY OF THE INVENTION

The present invention has been made in consideration of the above problems, and seeks to provide an SSB modulation and demodulation apparatus capable of obtaining optimum characteristics of a Hilbert converter upon changing the bandwidth of BPF.

It is another object of the present invention to provide an SSB modulation and demodulation apparatus capable of precisely changing the bandwidth of BPF.

It is a further object of the present invention to provide an SSB modulation and demodulation apparatus capable of providing a simple design of a Hilbert converter and making small the change amount of group delay time to thereby improve the quality of sounds.

According to an aspect of the present invention, there is provided an SSB modulation apparatus comprising a band-pass filter having a plurality of switchable bandwidths for restricting a signal transmission bandwidth, and Hilbert conversion means constructed of a network having a pass band over all frequency ranges for converting a modulating wave into two modulating waves each having a phase difference of 90 degrees, said apparatus comprising:

said Hilbert conversion means which is digital Hilbert conversion means arranged to be set with switchable Hilbert conversion coefficients;

Hilbert conversion characteristics changeover information storage means for storing a plurality of Hilbert conversion coefficients corresponding to a plurality of Hilbert conversion coefficients for different bandwidths and different sideband suppressions; and Hilbert conversion characteristics changeover means responsive to a change in the bandwidth of said band-pass filter for reading corresponding ones of said Hilbert conversion coefficients from said Hilbert conversion characteristics changeover information storage means, and supplying said read-out Hilbert conversion coefficients to said digital Hilbert conversion means to change said Hilbert conversion coefficients previously set.

According to another aspect of the present invention, there is provided an SSB demodulation apparatus comprising a band-pass filter having a plurality of switchable bandwidths for restricting La signal reception bandwidth, carrier generator means for generating first and second carriers each having a phase difference of 90 degrees, first multiplier means for multiplying an SSB modulated wave by said first carrier, second multiplier means for multiplying said SSB modulated wave by said second carrier, and Hilbert conversion means constructed of a network having a pass band over all frequency ranges for shifting an output from said first multiplier means by 90 degrees from an output from said second multiplier means, said apparatus comprising:

said Hilbert conversion means which is digital Hilbert conversion means arranged to be set with switchable Hilbert conversion coefficients;

Hilbert conversion characteristics changeover information storage means for storing a plurality of Hilbert conversion coefficients corresponding to a plurality of Hilbert conversion coefficients for different bandwidths and different sideband suppressions; and Hilbert conversion characteristics changeover means responsive to a change in the bandwidth of said band-pass filter for reading corresponding ones of said Hilbert conversion coefficients from said Hilbert conversion characteristics changeover information storage means, and supplying said read-out Hilbert conversion coefficients to said digital Hilbert conversion means to change said Hilbert conversion coefficients previously set.

According to a further aspect of the present invention, there is provided an SSB modulation/demodulation apparatus comprising:

said band-pass filter which is a digital band-pass filter arranged to be set with switchable filter coefficients;

filter characteristics changeover information storage means for storing a plurality of filter coefficients corresponding to a plurality of filter coefficients for different bandwidths; and filter coefficients changeover means responsive to a bandwidth changeover instruction for said band-pass filter for reading corresponding ones of said plurality of filter coefficients from said filter characteristics changeover information storage means, and supplying said read-out filter coefficients to said band-pass filter to change said filter coefficients previously set.

According to a still further aspect of the present invention, there is provided an SSB modulation/demodulation apparatus wherein:

said digital Hilbert conversion means is arranged to be set with switchable filter coefficients and arranged to change the number of filter orders;

said Hilbert conversion characteristics changeover information storage means stores said filter coefficients and the filter order data for each of said Hilbert conversion characteristics; and said Hilbert conversion characteristics changeover means is responsive to a change of the bandwidth of said band pass filter, reads corresponding ones of said Hilbert conversion coefficients and filter order data, supplies said read-out Hilbert conversion coefficients to said digital Hilbert conversion means to change said Hilbert conversion coefficients set previously, and changes the number of filter orders in accordance with said read out filter order data.

DETAILED DESCRIPTION OF THE PREFERRED EMBODIMENTS

Figure 1:
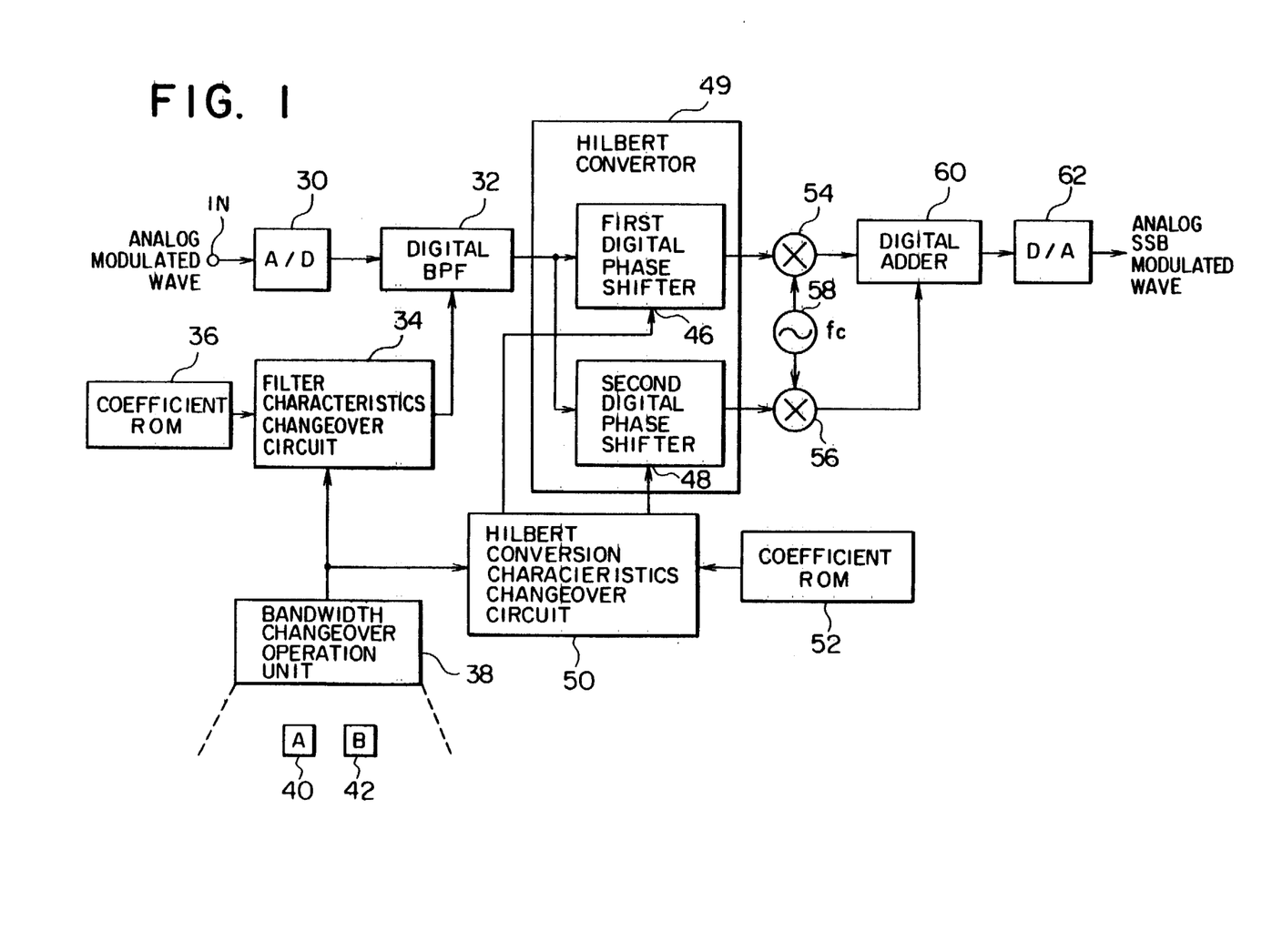
FIG. 1 is a block diagram showing a first embodiment of the digital SSB modulation apparatus according to the present invention.

The first embodiment of this invention will be described with reference to the block diagram of FIG. 1 showing the digital SSB modulation apparatus.

An analog modulating wave (analog audit signal) inputted to an input terminal IN is converted into a digital modulating wave by an A/D converter 30.

There is connected at the output side of the A/D converter 30 a digital band-pass filter (digital BPF) 32 for allowing signals to pass only within a predetermined bandwidth.

This digital BPF 32 is arranged to be switchable between broad and narrow bandwidths by changing filter coefficients thereof.

There is connected to digital BPF 32 a filter characteristics changeover circuit 34 which is connected with a coefficient ROM 36 and a bandwidth changeover operation unit 38. The coefficient ROM 36 or filter characteristics changeover information storage means stores first filter coefficients for broad bandwidth filter characteristics and second filter coefficients for narrow bandwidth filter characteristics. The bandwidth changeover operation unit 38 is provided with key A 40 for switching to a broad bandwidth and key B 42 for switching to a narrow bandwidth. Upon user activation of either of keys A and B, a key-on signal or bandwidth changeover instruction is outputted to the filter characteristics changeover circuit 34.

Upon reception of the key-on signal in response to activation of either of keys A 40 and B 42, the filter characteristics changeover circuit 34 reads the first or second filter coefficients from the coefficient ROM 36 and supplies them to digital BPF 32 to change the filter coefficients.

The filter characteristics of digital BPF 32 are definitely determined by the selected filter coefficients. The filter characteristics do not fluctuate and no adjustment is necessary once the filter coefficients for desired filter characteristics have been designed.

There are connected at the output side of digital BPF 32 first and second digital phase shifters 46 and 48 which Hilbert-convert the bandwidth limited digital modulating wave into first and second digital modulating waves each having a phase difference of 90 degrees. The first and second digital phase shifters 46 and 48 constitute a Hilbert converter means 49.

The first and second phase shifters 46 and 48 are each constructed of networks having the same order and a pass band over all frequency ranges The Hilbert conversion coefficients of the phase shifters 46 and 48 are arranged to be switchable. To this end, a Hilbert conversion characteristics changeover circuit 50 is connected to the first and second digital phase shifters 46 and 48.

The Hilbert conversion characteristics changeover circuit 50 is connected with a coefficient ROM 52 and the bandwidth changeover operation unit 38. The coefficient ROM 52 or Hilbert conversion characteristics information storage means stores therein first and second Hilbert conversion coefficients for use by the Hilbert converter 49. The first Hilbert conversion coefficients are used for obtaining Hilbert conversion characteristics (refer to the solid line curve A shown in FIG. 2) which have a broad bandwidth for ensuring the 90 degree phase difference and a somewhat poor sideband suppression. The second Hilbert conversion coefficients are used for obtaining Hilbert conversion characteristics (refer to the broken line curve B shown in FIG. 2) which have a narrow bandwidth for ensuring the 90 degree phase difference and a higher sideband suppression.

Upon reception of a key-on signal in response to activation of either key A 40 and key B 42, the Hilbert conversion characteristics changeover circuit 50 reads the first or second Hilbert conversion coefficients from the coefficient ROM 52, and supplies them to the first phase shifter 46 and second phase shifter 48 of the Hilbert converter 49 to thereby change the Hilbert conversion coefficients.

The Hilbert conversion characteristics of the Hilbert converter 49 are definitely determined by the selected Hilbert conversion coefficients. The Hilbert conversion characteristics do not fluctuate and no adjustment is necessary once the Hilbert conversion coefficients for desired Hilbert conversion characteristics have been designed.

The first and second digital phase shifters 46 and 48 are connected to first and second digital multipliers 54 and 56, respectively.

A digital carrier wave generator 58 is connected to the first and second digital multipliers 54 and 56. The digital carrier wave generator 58 generates first and second digital carriers each having a carrier frequency fc and a phase difference of 90 degrees. The first digital multiplier 54 multiplies the first digital modulating wave by the first digital carrier, whereas the second digital multiplier 56 multiplies the second digital modulating wave by the second digital carrier.

Connected to the first and second digital multipliers 54 and 56 is a digital adder 60 which adds together first and second multiplication signals outputted from the multipliers 54 and 56 to thereby generate a digital SSB (LSB) modulated wave.

If a digital subtracter is used in place of the digital adder 60, a digital SSB (USB) modulated wave is generated.

Connected to the digital adder 60 is a D/A converter 62 which D/A converts the digital SSB modulated wave into an analog SSB modulated wave.

The operation of the above embodiment will be described with reference to FIGS. 2 and 3.

Assuming that a user intends to transmit an audio signal while retaining a broad bandwidth to be occupied, key A 40 on the bandwidth changeover operation unit 38 is turned on.

A key-on signal (a changeover instruction to make the bandwidth broad) is then supplied to the filter characteristics changeover circuit 34 and Hilbert characteristics changeover circuit 50.

The filter characteristics changeover circuit 34 then reads from the coefficient ROM 36 the first filter coefficients for broad bandwidth characteristics, and supplies them to digital BPF 32 to change the filter coefficients. The bandwidth of digital BPF 32 is thereby made broad.

Upon reception of the key-on signal in response to activation of key A 40, the Hilbert conversion characteristics changeover circuit 50 reads from the coefficient ROM 52 the first Hilbert conversion coefficients for broad bandwidth characteristics, and supplies them to the first and second digital phase shifters 46 and 48 of the Hilbert converter 49 to change the Hilbert conversion coefficients. The sideband suppression characteristics of the first and second digital phase shifters 54 and 56 will thereby become as shown by the solid line curve A in FIG. 2.

Since digital BPF 32 is constructed of digital circuits, the characteristics thereof are correctly set while ensuring a broad bandwidth. Since the Hilbert converter 49 is also constructed of digital circuits, the Hilbert conversion characteristics thereof are correctly set while ensuring a broad bandwidth corresponding to that of digital BPF 32.

An analog modulating wave inputted to the A/D converter 30 is converted into a digital modulating wave which is then supplied to digital BPF 32.

The digital modulating wave allowed to have a broad bandwidth by digital BPF 32 is then supplied to the first and second digital phase shifters 46 and 48 which Hilbert-convert the digital modulating wave into first and second digital modulating waves each having a phase difference of 90 degrees. In this case, the 90 degree phase difference is ensured by the broad bandwidth of digital BPF 32.

The first and second digital modulating waves are multiplied by the first and second digital carriers by the first and second digital multipliers 54 and 56, respectively, and the results are added together by the adder 60 to generate a digital SSB modulated wave. The digital SSB modulated wave is then converted by the D/A converter 62 into an analog SSB modulated wave.

Figure 2:
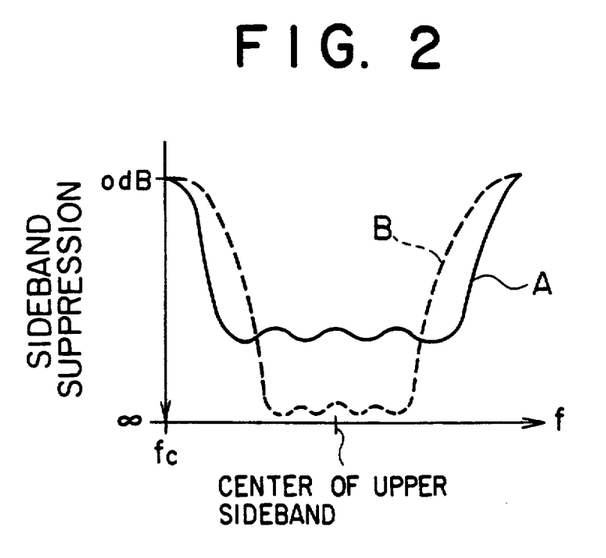
FIG. 2 is a graph showing sideband suppression by the Hilbert converter shown in FIG. 1.
Figure 3:
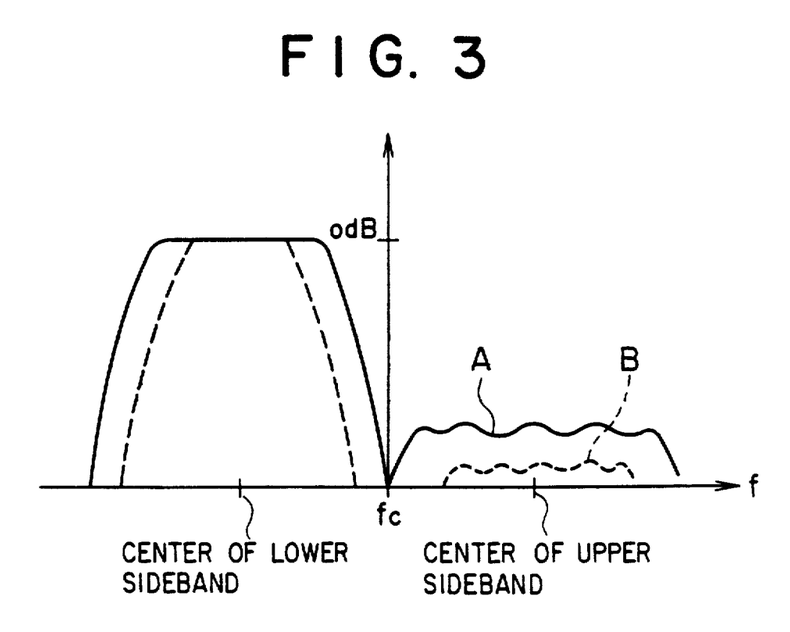
FIG. 3 is a graph showing the frequency-gain characteristics of the SSB modulation apparatus shown in FIG. 1, with respect to the stop band and pass band.

Since the Hilbert conversion characteristics of the first and second digital phase shifters 46 and 48 have the broad bandwidth, the sideband suppression is somewhat poor as shown by the solid line curve A in FIG. 2. The frequency-gain characteristics of this digital SSB modulation apparatus with respect to the pass band and stop band becomes as indicated by the solid line curve A in FIG. 3. As seen from FIG. 3, the pass band has a broad bandwidth, whereas the sideband suppression for the stop band becomes somewhat poor. In this case, however, since the Hilbert conversion characteristics of the first and second digital phase shifters 46 and 48 are correctly set to have the broad bandwidth corresponding to that of digital BPF 32, there are no spurious signals of high level such as shown by the solid line curve A in FIG. 9.

Next, assuming that a user intends to transmit an audio signal while retaining a narrow bandwidth to be occupied, key B 42 on the bandwidth changeover operation unit 38 is turned on.

A key-on signal (a changeover instruction to make the bandwidth narrow) is then supplied to the filter characteristics changeover circuit 34 and Hilbert characteristics changeover circuit 50.

The filter characteristics changeover circuit 34 then reads from the coefficient ROM 36 the second filter coefficients for narrow bandwidth characteristics, and supplies them to digital BPF 32 to change the filter coefficients. The bandwidth of digital BPF 32 is thereby made narrow.

Upon reception of the key-on signal in response to activation of key B 42, the Hilbert conversion characteristics changeover circuit 50 reads from the coefficient ROM 52 the second Hilbert conversion coefficients for narrow bandwidth characteristics, and supplies them to the first and second digital phase shifters 46 and 48 of the Hilbert converter 49 to change the Hilbert conversion coefficients. The sideband suppression characteristics of the first and second digital phase shifters 54 and 56 will thereby become as shown by the broken line curve B in FIG. 2.

Since digital BPF 32 is constructed of digital circuits, the characteristics thereof are correctly set while ensuring La narrow bandwidth. Since the Hilbert converter 49 is also constructed of digital circuits, the Hilbert conversion characteristics thereof are correctly set while ensuring a narrow bandwidth corresponding to that of digital BPF 32.

Since the Hilbert conversion characteristics have the narrow bandwidth, the sideband suppression is improved as shown by the solid line curve B in FIG. 2. The frequency-gain characteristics of this digital SSB modulation apparatus with respect to the pass band and top band becomes as indicated by the broken line curve in FIG. 3. As seen from FIG. 3, although the pass and has a narrow bandwidth, the sideband suppression for the stop band becomes large to thereby make spurious signals from the stop band considerably small.

According to the above embodiment, there are provided digital BPF 32, and coefficient ROM 36 which stores the first and second filter coefficients corresponding to the two types of filter characteristics for broad and narrow bandwidths. Upon turning on either of keys A 40 and B 42 on the bandwidth changeover operation unit 38 provided for the broad and narrow bandwidths, respectively, the filter characteristics changeover circuit 34 reads from the coefficient ROM 36 the corresponding filter coefficients, and supplies them to digital BPF 32 to change the filter coefficients. Accordingly, a single digital BPF 32 can be used switchable between two types of filter characteristics, to thereby save the mounting space. The desired filter characteristics can be selected correctly, without variation in the filter characteristics and without any filter adjustment.

The Hilbert converter 49 is arranged to perform digital Hilbert conversion. The Hilbert conversion coefficients corresponding to the two types of Hilbert conversion characteristics for broad and narrow bandwidths are stored in the coefficient ROM 52. Upon turning on either of keys A 40 and B 42 on the bandwidth changeover operation unit 38, as the bandwidth of digital BPF 32 is changed, the Hilbert conversion characteristics changeover circuit 50 reads from the coefficient ROM 52 the corresponding Hilbert coefficients, and supplies them to the Hilbert converter 49 to change the Hilbert conversion coefficients. Accordingly, a single Hilbert converter 49 can be used switchable between two types of Hilbert conversion characteristics. The desired Hilbert conversion characteristics can be selected correctly, in correspondence with a change in the filter characteristics of digital BPF 32. Accordingly, there is no variation in the Hilbert conversion characteristics filter characteristics, and there is not needed any filter adjustment. If the bandwidth is set narrow, the sideband suppression for the stop band is made large to thereby improve the suppression of spurious signals. If on the other hand the bandwidth is set broad, generation of spurious signals of high level can be avoided to thus obtain an optimum spurious signal suppression for a given bandwidth.

Figure 4:
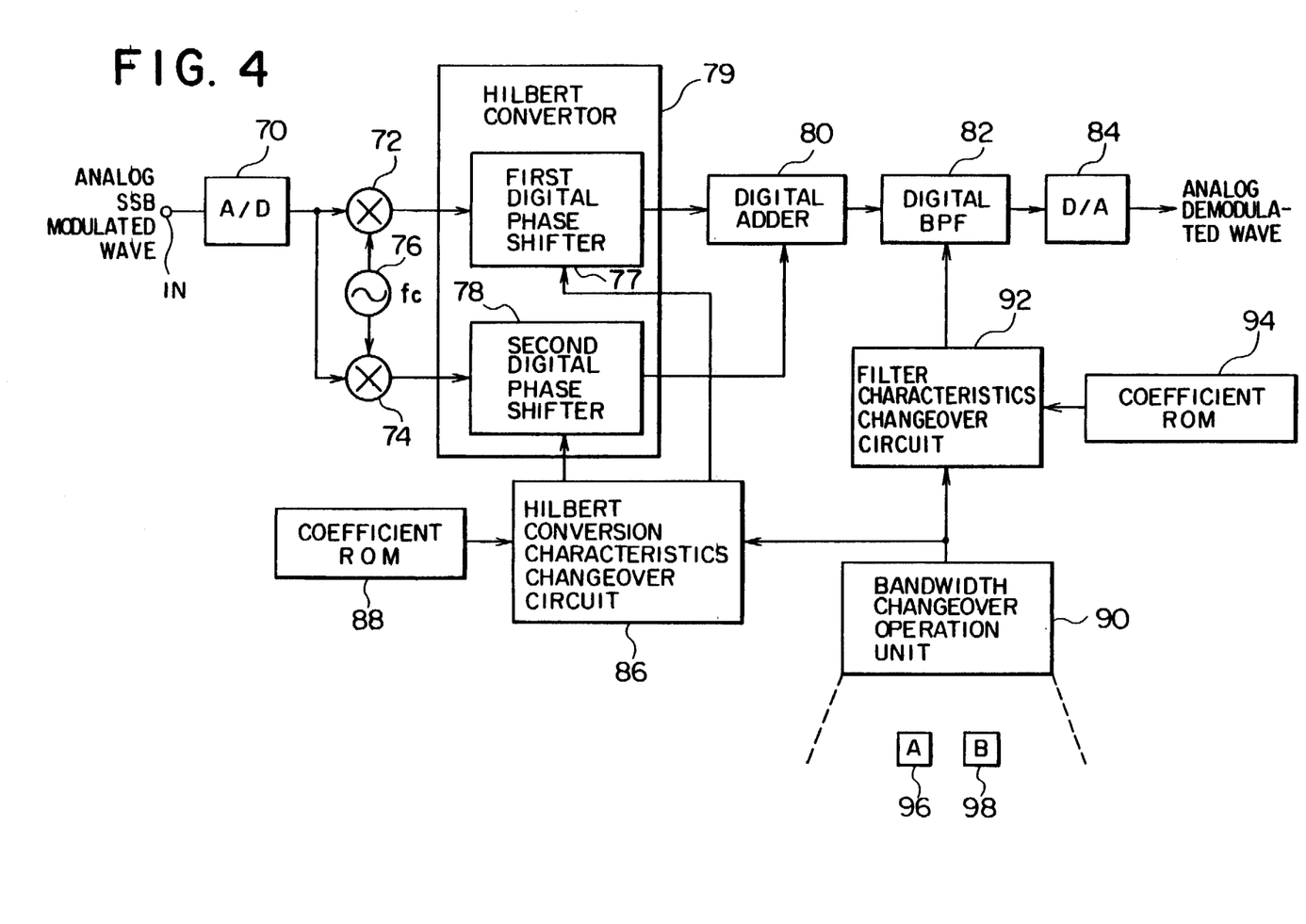
FIG. 4 is a block diagram showing a second embodiment of the digital SSB demodulation apparatus according to the present invention.

The second embodiment of this invention will be described with reference to the block diagram of FIG. 4 showing the digital SSB demodulation apparatus.

An analog SSB modulated wave inputted to an input terminal IN is converted into a digital SSB modulated wave by an A/D converter 70.

There are connected at the output side of the A/D converter 70 first and second digital multipliers 72 and 74. A carrier generator 76 is connected to the first and second digital multipliers 72 and 74, and generates first and second digital carriers each having a carrier frequency fc and a phase difference of 90 degrees. The first and second digital multipliers 72 and 74 multiply the digital SSB modulated wave by the first and second carriers, respectively, to generate first and second digital multiplication signals.

The first and second digital multipliers 72 and 74 are connected to first and second digital phase shifters 77 and 78 which Hilbert-Convert the first and second digital multiplication signals so as to give a phase difference of 90 degrees therebetween.

The first and second digital phase shifters 77 and 78 constitute a Hilbert converter 79.

There is connected at the output sides of the first and second digital phase shifters 77 and 78 a digital adder 80 which adds together the first and second digital multiplication signals subjected to Hilbert conversion, to thereby generate a digital demodulated wave.

A digital BPF 82 is connected at the output side of the digital adder 80. The digital demodulated wave is restricted to have a predetermined bandwidth by digital BPF 82, and thereafter D/A converted by a D/A converter 84 to generate an analog demodulated wave.

Digital BPF 82 is used for limiting the bandwidth of the demodulated signal to thereby determine the interference elimination characteristics and the quality of sounds.

The Hilbert converter 79 and digital BPF 82 have the similar structure as that of the Hilbert converter 49 and digital BPF 32 of the first embodiment, and arranged to switchably use the Hilbert conversion coefficients and filter coefficients.

Connected to the Hilbert converter 79 is a Hilbert conversion characteristics changeover circuit 86 similar in structure to that shown in FIG. 1 which is connected to a coefficient ROM 88 and bandwidth changeover operation unit 90 similar in structure to those shown in FIG. 1.

Connected to digital BPF 82 is a filter characteristics changeover circuit 92 similar in construction to that shown in FIG. 1 which is connected to a coefficient ROM 94 and the bandwidth changeover operation unit 90 similar in structure to those shown in FIG. 1.

The operation of the second embodiment will be described in the following.

If the communication band is relatively empty and a user intends to receive an analog SSB modulated signal taking preference to the quality of sounds, key A 96 on the bandwidth changeover operation unit 90 is turned on.

Upon reception of a key-on signal from the bandwidth changeover operation unit 90, the filter characteristics changeover circuit 92 reads from the coefficient ROM 94 the first filter coefficients for the broad bandwidth characteristics, and supplies them to digital BPF 82 to change the filter coefficients. As a result, the bandwidth of digital BPF 82 becomes broad and the clarity of communication becomes good.

Upon reception of the key-on signal in response to activation of key A 96, the Hilbert conversion characteristics changeover circuit 86 reads from the coefficient ROM 88 the first Hilbert conversion coefficients for the broad bandwidth, and supplies them to the first and second digital phase shifters 77 and 78 of the Hilbert converter 79 to thereby change the Hilbert conversion coefficient&s. As a result, the sideband suppression characteristics of the first and second digital phase shifters 77 and 78 becomes like that shown by the solid line curve A in FIG. 2.

An inputted analog SSB modulated wave is converted into a digital SSB modulated wave by the A/D converter 70.

The digital SSB modulated wave is multiplied by the first and second digital carriers each having a phase shift of 90 degrees by the first and second digital multipliers 72 and 74, respectively, to generate the first and second digital multiplication signals.

The first and second multiplication signals are Hilbert-converted by the Hilbert converter 79 to give a phase difference of 90 degrees therebetween, and added together by the digital adder 80 to generate a digital demodulated wave.

The digital demodulated wave is restricted to have a predetermined bandwidth by digital BPF 82, and thereafter converted into an analog modulated wave by the D/A converter 84.

The phase difference of 90 degrees is ensured at the Hilbert converter 79 having the broad bandwidth corresponding to that of digital BPF 82.

Although the sideband suppression is somewhat poor as indicated by the solid line curve A in FIG. 2, the Hilbert conversion characteristics is set broad in correct correspondence with that of digital BPF 82. Therefore, interference level between analog demodulated waves does not become too large.

If key B 98 is turned on in order to lessen the interference with another transmitter station using a nearby frequency, a key-on signal in response to turning on key B 98 is supplied to the filter characteristics changeover circuit 92. This circuit 92 then reads from the coefficient ROM 94 the second filter coefficients for the narrow bandwidth characteristics, and supplies them to digital BPF 82 to change the filter coefficients. The bandwidth of digital BPF 92 is thereby made narrow and interference can be avoided.

Upon reception of the key-on signal in response to turning on key B 98, the Hilbert conversion characteristics changeover circuit 86 reads from the coefficient ROM 88 the second Hilbert conversion coefficients for the narrow bandwidth characteristics, and supplies them to the first and second digital phase shifters 77 and 78 of the Hilbert converter 79 to change the Hilbert conversion coefficients. The sideband suppression characteristics of the first and second digital phase shifters 77 and 7 are thereby made like that as indicated by the broken line curve B in FIG. 2.

The sideband suppression is therefore made large to make the interference level between analog demodulated waves considerably small.

In the first and second embodiments described above, instead of digital BPFs 32 and 82, a plurality of analog BPFs each having different filter characteristics may be used by switching them in response to a bandwidth changeover instruction.

In such a case, an A/D converter is connected to the output side of analog BPF in the case of the first embodiment shown in FIG. 1, and a D/A converter is connected to the preceding stage of analog BPF in the case of the second embodiment shown in FIG. 4.

Also in the first and second embodiments described above, the Hilbert conversion characteristics of the Hilbert converters 49 and 79 are arranged to be changed in accordance with the Hilbert conversion coefficients. The invention is not limited thereto. For example, each of the first and second phase shifters may be constructed of a plurality of digital filters connected in tandem, and the number of filter orders may be changed as the Hilbert conversion coefficients are changed.

Figure 5:
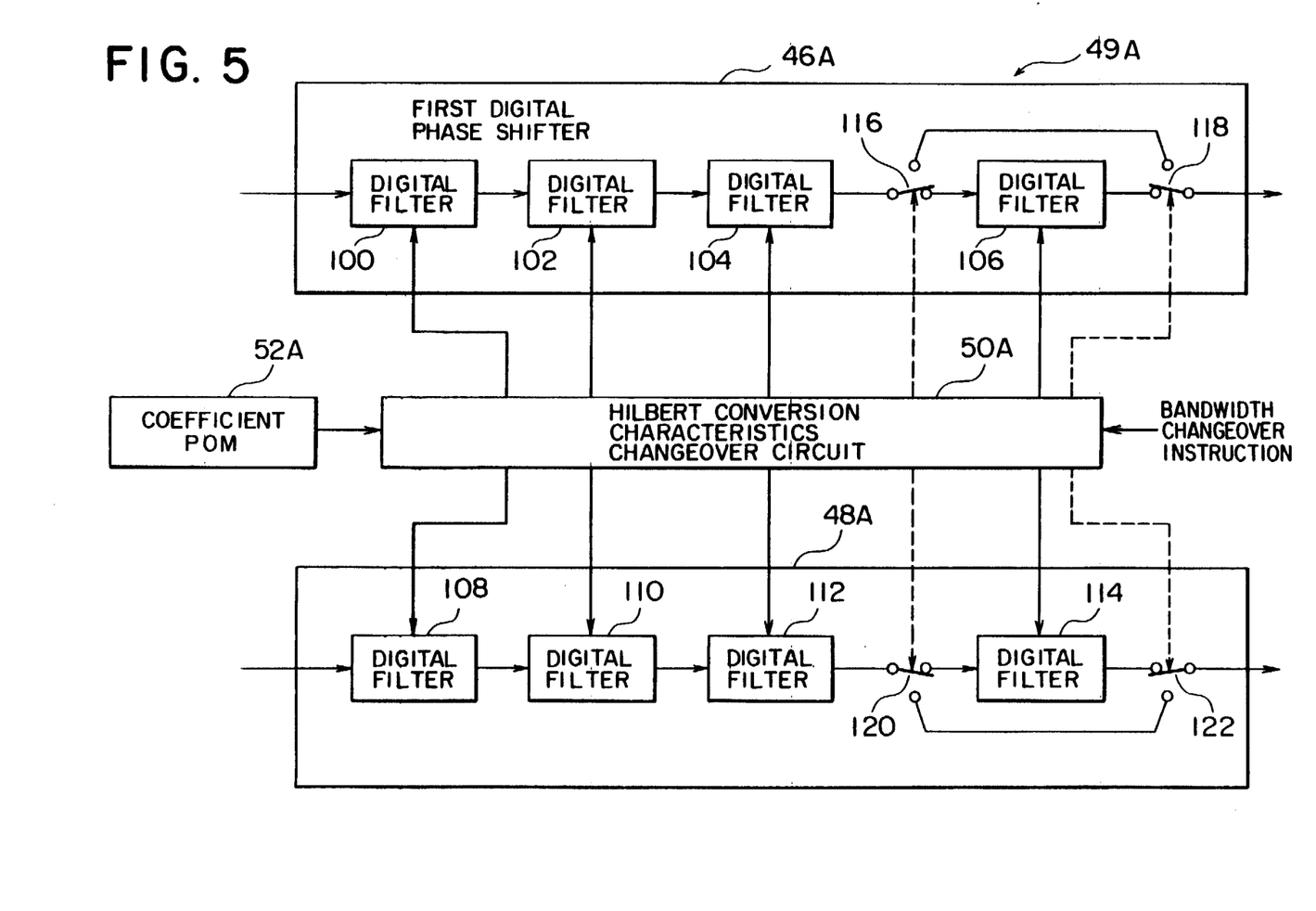
FIG. 5 partially shows a modification of the digital SSB modulation apparatus shown in FIG. 1.

For example, as shown in FIG. 5, the Hilbert converter 49 may be constructed of first and second digital phase shifters 46A and 46B respectively having four digital filters 100 to 106 and 108 to 114 connected in tandem. For the broad bandwidth Hilbert conversion characteristics, switches 116 to 122 are made connected to a side contacts to use four digital filters 100 to 106 and four digital filters 108 to 114. For the narrow bandwidth Hilbert conversion characteristics, switches 116 to 112 are made connected to b side contacts to use three digital filters 100 to 104 and three digital filters 108 to 112. In this case, in a coefficient ROM 52a there are stored first Hilbert conversion characteristics information including the Hilbert conversion coefficients for eight broad bandwidth digital filters and filter order data "4", and second Hilbert conversion characteristics information including the Hilbert conversion coefficients for six narrow bandwidth digital filters and filter order data "3".

Upon reception of a key-on signal in response to activation of key A 40, a Hilbert conversion characteristics changeover circuit 50A reads the first Hilbert conversion characteristics information, and while referring to the filter order data "4" the switches 116 to 122 are made connected to a side contacts, so that the Hilbert conversion coefficients for eight digital filters 100 to 114 are supplied thereto to set the broad bandwidth Hilbert conversion characteristics. On the contrary, upon reception of a key-on signal in response to activation of key B 42, it reads the second Hilbert conversion characteristics information, and while referring to the filter order data "3" the switches 116 to 122 are made connected to b side contacts, so that the Hilbert conversion coefficients for six digital filters 100 to 104 and 108 to 112 are supplied thereto to set the narrow bandwidth Hilbert conversion characteristics.

With the above arrangement, the narrow bandwidth Hilbert conversion characteristics can be realized by three digital filters, thereby allowing a simple design for the coefficients, and making small a change amount in group delay time within the bandwidth to improve the phase characteristics and the quality of sounds.

The above arrangement may also be applied to the Hilbert converter 79 shown in FIG. 4.

According to the SSB modulation apparatus of this invention, there is provided the Hilbert converter for performing digital Hilbert conversion, the Hilbert converter being a digital Hilbert converter arranged to be set with switchable Hilbert conversion coefficients. There are stored in the Hilbert conversion characteristics changeover information memory a plurality of Hilbert conversion coefficients corresponding to a plurality of Hilbert conversion coefficients for different bandwidth and different sideband suppressions which ensure a phase difference of 90 degrees. The Hilbert conversion characteristics changeover unit responds to a change in the bandwidth of the band-pass filter, reads corresponding ones of the Hilbert conversion coefficients from the Hilbert conversion characteristics changeover information memory, and supplies the read-out Hilbert conversion coefficients to three digital Hilbert converter to change the Hilbert conversion coefficients previously set. Accordingly, spurious signals of high level can be avoided reliably even with a broad transmission bandwidth. On the contrary, with a narrow transmission bandwidth, the sideband suppression is made large to suppress spurious signal to a minimum level. It is therefore possible to switchably select optimum Hilbert conversion characteristics suitable for a given transmission bandwidth, without any burden on adjustment of the Hilbert conversion characteristics.

According to the SSB demodulating apparatus of this invention, there is provided the Hilbert converter for performing digital Hilbert conversion, the Hilbert converter being a digital Hilbert converter arranged to be set with switchable Hilbert conversion coefficients. There are stored in the Hilbert conversion characteristics changeover information memory a plurality of Hilbert conversion coefficients corresponding to a plurality of Hilbert conversion coefficients for different bandwidths and different sideband suppressions which ensure a phase difference of 90 degrees. The Hilbert conversion characteristics changeover unit responds to a change in the bandwidth of the band-pass filter, reads corresponding ones of the Hilbert conversion coefficients from the Hilbert conversion characteristics changeover information memory, and supplies the read-out Hilbert conversion coefficients to three digital Hilbert converter to change the Hilbert conversion coefficients previously set. Accordingly, interference of high level can be avoided reliably even with a broad reception bandwidth. On the contrary, with a narrow reception bandwidth, the sideband suppression is made large to suppress interference to a minimum level. It is therefore possible to switchably select optimum Hilbert conversion characteristics suitable for a given reception bandwidth, without any burden on adjustment of the Hilbert conversion characteristics.

According to the SSB modulation (demodulation) apparatus of this invention, the band-pass filter uses a digital band-pass filter arranged to be set with switchable filter coefficients. A plurality of filter coefficients corresponding to a plurality of filter coefficients for different bandwidths are stored in the filter characteristics changeover information memory. The filter coefficients changeover unit responds to a bandwidth changeover instruction for the band pass filter for reading corresponding ones of the plurality of filter coefficients from the filter characteristics changeover information memory, and supplies the read-out filter coefficients to the band-pass filter to change the filter coefficients previously set. Accordingly, the bandwidth can be changed precisely, and the Hilbert conversion characteristics corresponding to the changed bandwidth are reliably selected without any burden on adjustment of the Hilbert conversion characteristics.

Further, according to the SSB modulation (demodulation) apparatus of this invention, the digital Hilbert converter is arranged to be set with switchable filter coefficients and arranged to change the number of filter orders. There are stored, in the Hilbert conversion characteristics changeover information memory, the filter coefficients and the filter order data for each of the Hilbert conversion characteristics. The Hilbert conversion characteristics changeover unit responds to a change of the bandwidth of the band-pass filter, reads corresponding ones of the Hilbert conversion coefficients and filter order data, supplies the read-out Hilbert conversion coefficients to the digital Hilbert converter to change the Hilbert conversion coefficients set previously, and changes the number of filter orders in accordance with the read out filter order data. Accordingly, a simple design for coefficients is possible while making small the change amount in group delay time within an occupied bandwidth and obtaining the good quality of sounds.

Although the present invention has been fully described in connection with the preferred embodiments thereof with reference to the accompanying drawings, it will be apparent to those skilled in the art that various changes and modifications of the present invention are possible within the scope of the following claims.

I claim:

1. An SSB modulation apparatus comprising a band-pass filter having a plurality of switchable bandwidths for restricting a signal transmission bandwidth, and Hilbert conversion means constructed of a network having a pass band over all frequency ranges for converting a modulating wave into two modulating waves each having a phase difference of 90 degrees, said apparatus comprising:

said Hilbert conversion means which is a digital Hilbert conversion means arranged to be set with switchable Hilbert conversion coefficients;

Hilbert conversion characteristics changeover information storage means for storing a plurality of Hilbert conversion coefficients corresponding to a plurality of Hilbert conversion coefficients for different bandwidths and different sideband suppressions; and Hilbert conversion characteristics changeover means responsive to a change in the bandwidth of said band-pass filter for reading corresponding ones of said Hilbert conversion coefficients from said Hilbert conversion characteristics changeover information storage means, and supplying said read-out Hilbert conversion coefficients to said digital Hilbert conversion means to change said Hilbert conversion coefficients previously set.

2. An SSB modulation apparatus according to claim 1, comprising:

said band-pass filter which is a digital band-pass filter arranged to be set with switchable filter coefficients;

filter characteristics changeover information storage means for storing a plurality of filter coefficients corresponding to a plurality of filter coefficients for different bandwidths; and filter coefficients changeover means responsive to a bandwidth changeover instruction for said band-pass filter for reading corresponding ones of said plurality of filter coefficients from said filter characteristics changeover information storage means, and supplying said read-out filter coefficients to said band-pass filter to change said filter coefficients previously set.

3. An SSB modulation apparatus according to claim 1 or 2, wherein said digital Hilbert conversion means is arranged to be set with switchable filter coefficients and arranged to change the number of filter orders;

said Hilbert conversion characteristics changeover information storage means stores said filter coefficients and the filter order data for each of said Hilbert conversion characteristics; and said Hilbert conversion characteristics changeover means is responsive to a change of the bandwidth of said band-pass filter, reads corresponding ones of said Hilbert conversion coefficients and filter order data, supplies said read-out Hilbert conversion coefficients to said digital Hilbert conversion means to change said Hilbert conversion coefficients set previously, and change the numbers of filter orders in accordance with said read-out filter order data.

4. An SSB modulation apparatus comprising a band-pass filter having a plurality of switchable bandwidths for restricting a signal reception bandwidth, carrier generator means for generating first and second carriers each having a phase difference of 90 degrees, first multiplier means for multiplying an SSB modulated wave by said first carrier, second multiplier means for multiplying said SSB modulated wave by said second carrier, and Hilbert conversion means constructed of a network having a pass band over all frequency ranges for shifting an output from said first multiplier means by 90 degrees from an output from said second multiplier means, said apparatus comprising:

said Hilbert conversion means which is a digital Hilbert conversion means arranged to be set with switchable Hilbert conversion coefficients;

Hilbert conversion characteristics changeover information storage means for storing a plurality of Hilbert conversion coefficients corresponding to a plurality of Hilbert conversion coefficients for different bandwidths and different sideband suppressions; and Hilbert conversion characteristics changeover means responsive to a change in the bandwidth of said band-pass filter for reading corresponding ones of said Hilbert conversion coefficients from said Hilbert conversion characteristics changeover information storage means, and supplying said read-out Hilbert conversion coefficients to said digital Hilbert conversion means to change said Hilbert conversion coefficients previously set.

5. An SSB demodulation apparatus according to claim 4, comprising:

said band-pass filter which is a digital band-pass filter arranged to be set with switchable filter coefficients;

filter characteristics changeover information storage means for storing a plurality of filter coefficients corresponding to a plurality of filter coefficients for different bandwidths; and filter coefficients changeover means responsive to a bandwidth changeover instruction for said band-pass filter for reading corresponding ones of said plurality of filter coefficients from said filter characteristics changeover information storage means, and supplying said read-out filter coefficients to said band-pass filter to change said filter coefficients previously set.

6. An SSB modulation apparatus according to claim 4 or 5, wherein said digital Hilbert conversion means is arranged to be set with switchable filter coefficients and arranged to change the number of filter orders;

said Hilbert conversion characteristics changeover information storage means stores said filter coefficients and the filter order data for each of said Hilbert conversion characteristics; and said Hilbert conversion characteristics changeover means is responsive to a change of the bandwidth of said band-pass filter, reads corresponding ones of said Hilbert conversion coefficients and filter order data, supplies said read-out Hilbert conversion coefficients to said digital Hilbert conversion means to change said Hilbert conversion coefficients set previously, and change the number of filter orders in accordance with said read-out filter order data.

* * * * *